United States Patent [19]

Shirato et al.

[11] Patent Number: 4,809,056

[45] Date of Patent: Feb. 28, 1989

[54] SEMICONDUCTOR DEVICE HAVING A SILICON ON INSULATOR STRUCTURE

[75] Inventors: Takehide Shirato, Hiratsuka; Nobuhiko Aneha, Yokohama, both of Japan

[73] Assignee: Fujitsu Limited, Kanagawa, Japan

[21] Appl. No.: 922,907

[22] Filed: Oct. 24, 1986

[30] Foreign Application Priority Data

Oct. 31, 1985 [JP] Japan .................................. 60-244433

[51] Int. Cl.⁴ ...................... H01L 23/48; H01L 29/46; H01L 29/54; H01L 29/62
[52] U.S. Cl. ......................................................... 357/71
[58] Field of Search .......................................... 357/71

[56] References Cited

FOREIGN PATENT DOCUMENTS 2496342  6/1982  France .
2520556  7/1983  France .
57-27069 2/1982  Japan .

OTHER PUBLICATIONS

IEEE Transactions on Electron Devices, vol. ED-32, No. 2, Feb., 1985, pp. 253-257; "Characteristics of MOSFET Prepared on Si/MgO.Al₂O₃/SiO₂/Si Structure".

*Primary Examiner*—Robert S. Macon
*Attorney, Agent, or Firm*—Armstrong, Nikaido, Marmelstein & Kubovcik

[57] ABSTRACT

A semiconductor device having an SOI structure comprises an insular single crystal silicon body formed on an insulator layer, a first region of a first type semiconductor and source and drain regions of a second type semiconductor provided in the insular single crystal silicon body so that the first region is provided between the source and drain regions, a second region of the first type semiconductor in contact with the first region formed along a side of the source and drain regions, and a contact region of the first type semiconductor having an impurity density higher than those of the first and second regions formed in contact with the second region, so that a fixed voltage can be applied to the first region via the contact region.

11 Claims, 4 Drawing Sheets

SEMICONDUCTOR DEVICE HAVING A SILICON ON INSULATOR STRUCTURE

BACKGROUND OF THE INVENTION

The present invention generally relates to semiconductor devices having a silicon on insulator structure, and more particularly to a semiconductor device having a silicon on insulator structure with a stable electrical characteristic.

A known semiconductor device having a silicon on insulator (hereinafter simply referred to as an SOI) structure is produced by forming a relatively thick insulator layer on a semiconductor substrate, forming a polysilicon layer on the insulator layer by a chemical vapor deposition, forming the polysilicon layer into a single crystal silicon layer by irradiating an energy beam or the like, forming an insular single crystal silicon body by a patterning process, and forming a semiconductor device on the insular single crystal silicon body. According to the SOI structure, a semiconductor integrated circuit (IC) including high voltage elements can be formed with ease because the isolation between elements is positively provided. In addition, the integration density of the semiconductor IC can be improved by employing a three-dimensional structure.

However, according to a conventional metal insulator semiconductor (hereinafter simply referred to as MIS) device having the SOI structure, it is impossible to apply a fixed voltage to the insular body on which the elements are formed. As a result, the insular body is in a floating state, and a leakage current is easily generated between a source and a drain due to a back channel at a lower portion of the insular body. Thus, there is a problem in that the electrical characteristic of the MIS device is unstable. Hence, there is a demand to realize a MIS device having the SOI structure in which it is possible to apply the fixed voltage to the insular body.

As a method of preventing the back channel without providing a contact for the insular body, there is a method of setting the impurity density of the insular body to a high density, but this method is impractical in that a current gain becomes greatly reduced.

On the other hand, the crystal property of the insular single crystal silicon body formed on the insulator layer of the SOI structure is deteriorated compared to that of a silicon substrate which is generally used. For this reason, the diffusion rate of impurities is extremely fast for the insular single crystal silicon body compared to that of the silicon substrate, and it is difficult to limit the depth of the impurity diffusion region under the thickness of the insular single crystal silicon body.

Metal oxide semiconductor (MOS) devices in which it is possible to apply a fixed voltage to the insular body are previously proposed in Japanese Laid-Open Patent Applications No. 57-27069 and No. 58-37966. According to these previously proposed devices, an insular p-type silicon body is formed on an insulating substrate made of sapphire, for example. An $n^+$-type source region and a p-type channel region adjacent thereto are provided in the insular body down to a boundary between the insulating substrate and the insular body. An $n^+$-type drain region is provided in the surface portion of the channel region, at a position separated from the source region. A $p^+$-type impurity region is provided adjacent to the channel region and the drain region down to the boundary. A gate electrode is provided on the channel region via a gate insulator layer. Hence, a fixed voltage may be applied to the channel region via the $p^+$-type impurity region which connects to a lower portion of the channel region under the drain region.

However, the thickness of the insular body is in the order of one micron, and the thickness of the drain region provided in the surface portion of the channel region is in the order of 0.2 micron. In actual practice, it is extremely difficult to control the thickness of the drain region to such a small thickness so that the drain region does not reach the boundary between the insulating substrate and the insular body when the insular body is made of single crystal silicon, as described before. Hence, there is a problem in that it is extremely difficult to produce such MOS devices.

In addition, according to the previously proposed devices, there is a problem in that the electrical characteristic of the MOS device changes depending on a positioning error of the gate electrode when the device is produced. Furthermore, there is a problem in that the width of the gate electrode cannot be set to a small value because the $p^+$-type impurity region will make contact with junctions between the channel region and the source and drain regions and cause a short circuit when the width of the gate electrode is narrow.

SUMMARY OF THE INVENTION

Accordingly, it is a general object of the present invention to provide a novel and useful semiconductor device having an SOI structure, in which the problems described heretofore are eliminated.

Another and more specific object of the present invention is to provide a semiconductor device having an SOI structure in which an insular single crystal silicon body is formed on an insulator layer, a first region of a first type semiconductor and source and drain regions of a second type semiconductor are provided in the insular single crystal silicon body so that the first region is provided between the source and drain regions, a second region of the first type semiconductor in contact with the first region is formed along a side of the source and drain regions, and a contact region of the first type semiconductor having an impurity density higher than those of the first and second regions is formed in contact with the second region, so that a fixed voltage can be applied to the first region via the contact region. According to the semiconductor device having the SOI structure of the present invention, it is possible to apply the fixed voltage to the insular body of the semiconductor device with ease. According to the present invention, it is possible to prevent the formation of a back channel which causes a leakage current between the source and the drain, without reading the current gain. Hence, it is possible to improve the stability and performance of elements on the semiconductor device and accordingly stabilize the electrical characteristic of the semiconductor device.

Other objects and further features of the present invention will be apparent from the following detailed description when read in conjunction with the accompanying drawings.

DETAILED DESCRIPTION

Figure 1A:
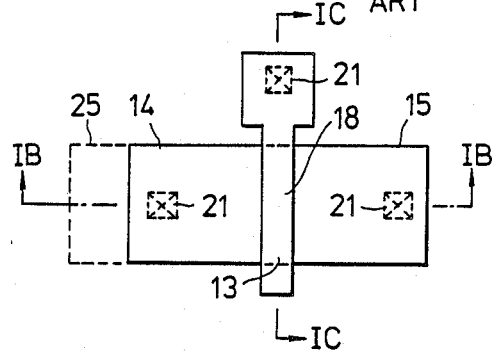
FIG. 1A is a plan view showing an example of the conventional semiconductor device having the SOI structure.

First, description will be given with respect to an example of the conventional semiconductor device having the SOI structure by referring to FIGS. 1A through 1C. FIGS. 1B and 1C are cross sectional views of the semiconductor device shown in FIG. 1A along lines IB—IB and IC—IC, respectively. An insulator layer 12 is formed on a silicon substrate 11, and an insular p-type single crystal silicon body 13 is provided on the insulator layer 12. An n+-type source region 14, an n+-type drain region 15 and a channel region 16 are formed in the insular body 13. A gate insulator layer 17 is formed on the channel region 16, and a gate electrode 18 is formed on the gate insulator layer 17. An oxide layer 19 is formed on the gate electrode 18, and a phospho-silicate glass (PSG) insulator layer 20 is formed on the oxide layer 19. Contact holes 21 are formed in the oxide layer 19 and the PSG insulator layer 20, and a gate wiring 22, a source wiring 23 and a drain wiring 24 are provided to make the necessary contact through the respective contact holes 21 as shown.

Figure 1B:
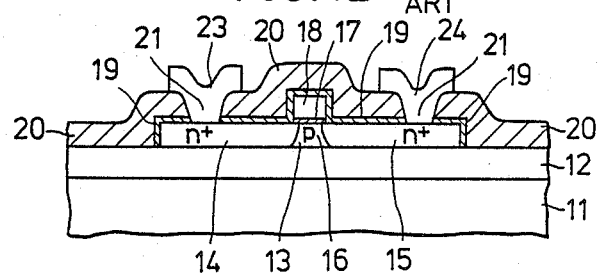
FIGS. 1B and 1C are cross sectional views of the semiconductor device shown in FIG. 1A along lines IB—IB and IC—IC, respectively.
Figure 1C:
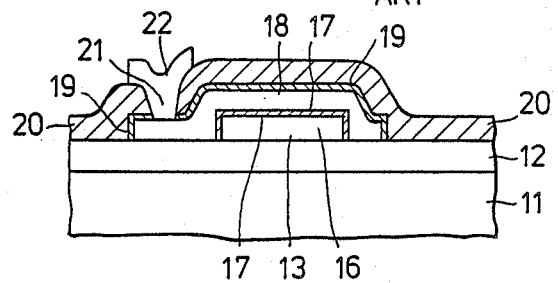

In the plan view shown in FIG. 1A, the illustration of the oxide layer 19, the PSG insulator layer 20, and the wirings 22 through 24 are omitted for convenience' sake.

The source and drain regions 14 and 15 are formed by selectively implanting n-type impurity ions into the insular body 13 by using the gate electrode 18 as a mask and thereafter activating the regions implanted with the impurity ions. However, due to the properties of the single crystal silicon, it is difficult to control the thickness of the source and drain regions 14 and 15, and the source and drain regions 14 and 15 inevitably reach the bottom of the insular body 13. In other words, the source and drain regions 14 and 15 reach a boundary between the insulator layer 12 and the insular body 13.

Accordingly, even when a p+-type contact region 25 indicated by a phantom line in FIG. 1A is provided on the outside of the source region 14 as in the case of a MIS transistor formed on a general semiconductor substrate, the source region 14 blocks the contact region 25 from being electrically connected to the insular body 13 under the gate electrode 18. For this reason, it is impossible to apply a fixed voltage to the insular body 13 (channel region 16) via the contact region 25. As a result, the conventional MIS device having the SOI structure has no contact for applying the fixed voltage to the insular body 13. In other words, the insular body 13 is in a floating state, and a leakage current is easily generated between the source region 14 and the drain region 15 due to a back channel at a lower portion of the insular body 13. Thus, there is a problem in that the electrical characteristic of the MIS device is unstable.

As a method of preventing the back channel without providing a contact for the insular body, there is a method of setting the impurity density of the insular body to a high density, but this method is impractical in that a current gain becomes greatly reduced.

Figure 2A:
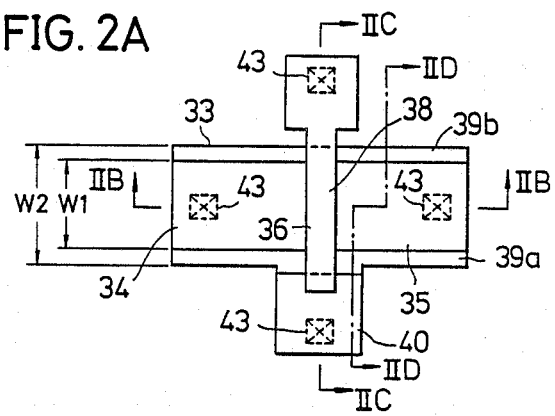
FIG. 2A is a plan view showing a first embodiment of the semiconductor device having the SOI structure according to the present invention.
Figure 2B:
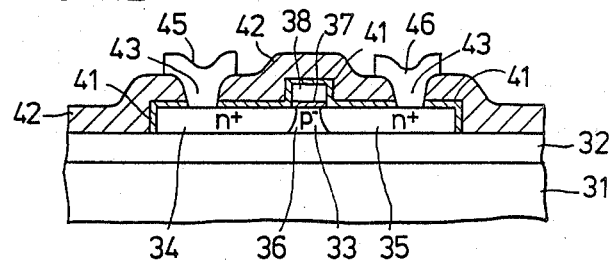
FIGS. 2B, 2C and 2D are cross sectional views of the semiconductor device shown in FIG. 2A along lines IIB—IIB, IIC—IIC and IID—IID, respectively.
Figure 2C:
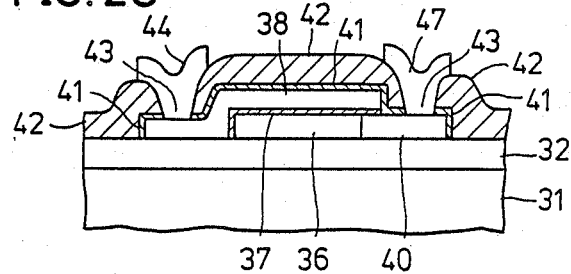
Figure 2D:
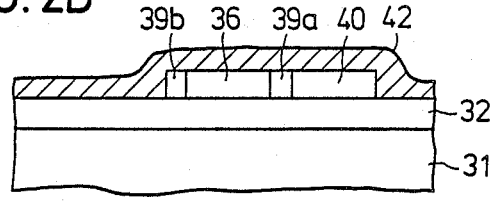

FIGS. 2A through 2D show a first embodiment of the semiconductor device having the SOI structure according to the present invention. FIGS. 2B, 2C and 2D are cross sectional views of the semiconductor device shown in FIG. 2A along lines IIB—IIB, IIC—IIC and IID—IID, respectively. A silicon dioxide ($SiO_2$) insulator layer 32 having a thickness in the order of one micron is formed on a silicon substrate 31, and an insular p⁻-type single crystal silicon body 33 having an impurity density in the range of $10^{14}$ cm$^{-3}$ to $10^{16}$ cm$^{-3}$ and a thickness of 0.5 micron is provided on the $SiO_2$ insulator layer 32. An n+-type source region 34 having an impurity density in the order of $10^{20}$ cm$^{-3}$, an n+-type drain region 35 having an impurity density in the order of $10^{20}$ cm$^{-3}$ and a p⁻-type channel region (hereinafter referred to as a first p⁻-type region) 36 are formed in the insular body 33. A $SiO_2$ gate insulator layer 37 is formed on the first p⁻-type region 36, and a polysilicon gate electrode 38 is formed on the gate insulator layer 37. Second p⁻-type regions 39a and 39b are respectively provided along the sides of the source and drains regions 34 and 35. A p+-type contact region 40 having an impurity density in the order of $10^{20}$ cm$^{-3}$ is provided adjacent to the second p⁻-type region 39a in contact therewith. A $SiO_2$ oxide layer 41 is formed on the gate electrode 38, and a PSG insulator layer 42 is formed on the oxide layer 41. Contact holes 43 are formed in the oxide layer 41 and the PSG insulator layer 42, and a gate wiring 44, a source wiring 45, a drain wiring 46 and a contact wiring 47 are provided to make the necessary contact through the respective contact holes 43 as shown. The impurity density of the contact region 40 is higher than those of the first and second p⁻-type regions 36 and 39a and 39b.

In the plan view shown in FIG. 2A, the illustration of the oxide layer 41, the PSG insulator layer 42, and the wirings 44 through 47 are omitted for convenience' sake.

A fixed voltage such as a ground potential from the contact wiring 47 is applied to the insular body 33, that is, to the first p⁻-type region 36 wherein the channel is formed, via the contact region 40. The contact region 40 also functions as a channel stopper.

According to the present embodiment, the n+-type source and drain regions 34 and 35 are formed so that a width W1 thereof is smaller than a width W2 of the insular p⁻-type single crystal body 33, and the second p⁻-type regions 39a and 39b which are in contact with the first p⁻-type region 36 are formed along the sides of the n+-type source and drain regions 34 and 35. In addition, the p+-type contact region 40 is formed in contact with the second p⁻-type region 39a. The p+-type contact region 40 and the first p⁻-type region 36 wherein the channel is formed are electrically connected without being blocked by the n+-type source and drain regions 34 and 35 which reach the bottom of the insular body 33.

Hence, it is possible to fix the first p⁻-type region 36 to the ground potential or the like via the p⁺-type contact region 40, and it is possible to prevent the formation of a back channel at the lower portion of the insular body 33. Therefore, it is possible to improve the stability and performance of elements (transistors) of the semiconductor device having the SOI structure, and the electrical characteristic of the semiconductor device is considerably improved.

Figure 3A:
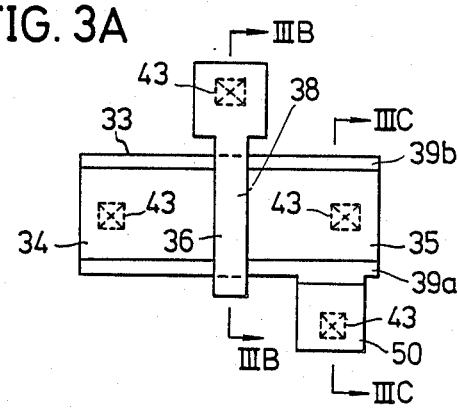
FIG. 3A is a plan view showing a second embodiment of the semiconductor device having the SOI structure according to the present invention.
Figure 3B:
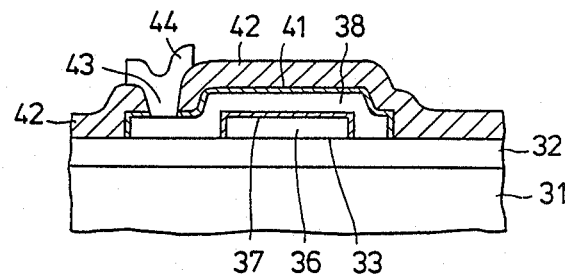
FIGS. 3B and 3C are cross sectional views of the semiconductor device shown in FIG. 3A along lines IIIB—IIIB and IIIC—IIIC, respectively.
Figure 3C:
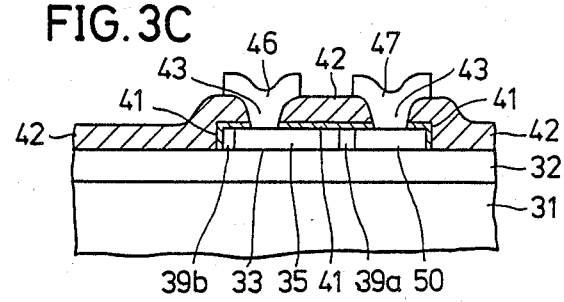

Next, description will be given with respect to a second embodiment of the semiconductor device having the SOI structure by referring to FIGS. 3A through 3C. FIGS. 3B and 3C are cross sectional views of the semiconductor device shown in FIG. 3A along lines IIIB—IIIB and IIIC—IIIC, respectively. In FIGS. 3A through 3C, those parts which are the same as those corresponding parts in FIGS. 2A through 2D are designated by the same reference numerals, and description thereof will be omitted.

The second embodiment only differs from the first embodiment described before in that a p⁺-type contact region 50 is formed in contact with the second p⁻-type region 39a at a position separated from the gate electrode 38 in the plan view. The effects of the second embodiment are basically the same as those of the first embodiment, except that the contact region 50 does not function as a channel stopper as in the case of the contact region 40.

Next, description will be given with respect to third through sixth embodiments of the semiconductor device having the SOI structure according to the present invention by referring to FIGS. 4 through 7. In FIGS. 4 through 7, those parts which are the same as those corresponding parts in FIGS. 2A through 2D are designated by the same reference numerals, and description thereof will be omitted.

Figure 4:
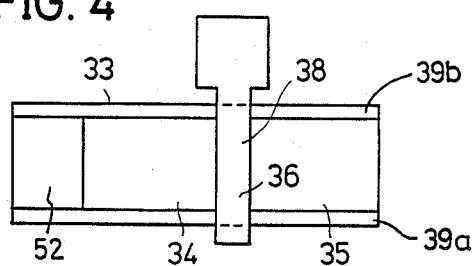
FIGS. 4 through 7 are plan views respectively showing third through sixth embodiments of the semiconductor device having the SOI structure according to the present invention.

In the third embodiment shown in FIG. 4, the illustration of the oxide layer 41, the PSG insulator layer 42, the contact holes 43 and the wirings 44 through 47 are omitted for convenience' sake. A p⁺-type contact region 52 is formed adjacent to the n⁺-type source region 34. The second p⁻-type regions 39a and 39b extend along the sides of the n⁺-type source and drain regions 34 and 35 and the sides of the p⁺-type contact region 52. The p⁺-type contact region 52 is in contact with the second p⁻-type regions 39a and 39b, and the p⁺-type contact region 52 and the first p⁻-type region 36 wherein the channel is formed are electrically connected without being blocked by the n⁺-type source and drain regions 34 and 35 which reach the bottom of the insular body 33. Generally, the source potential is approximately equal to the potential of the insular body or is lower than the drain potential. For this reason, it is possible to more positively prevent a breakdown at the junction when the contact region is formed adjacent to the source region rather than adjacent to the drain region.

Figure 5:
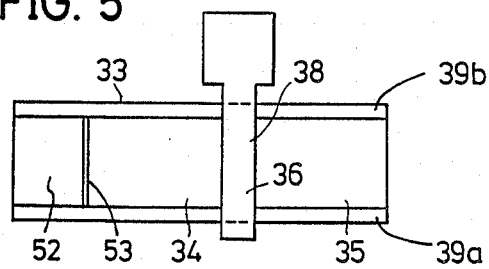

The fourth embodiment shown in FIG. 5 is basically the same as the third embodiment except that an insulator layer 53 which reaches the bottom of the insular body 33 is provided between the p⁺-type contact region 52 and the n⁺-type source region 34.

Figure 6:
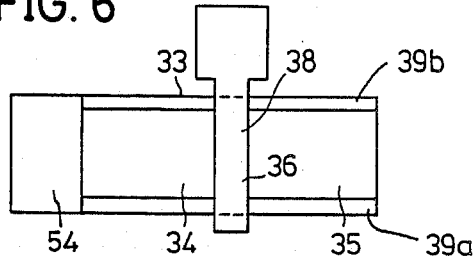

In a fifth embodiment shown in FIG. 6, a p⁺-type contact region 54 is formed adjacent to the n⁺-type source region 34. The p⁺-type contact region 54 is in contact with the end portions of the second p⁻-type regions 39a and 39b, and the p⁺-type contact region 54 and the first p⁻-type region 36 wherein the channel is formed are electrically connected without being blocked by the n⁺-type source and drain regions 34 and 35 which reach the bottom of the insular body 33.

Figure 7:
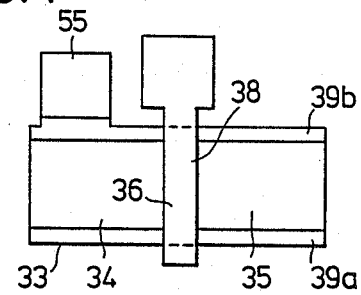

The sixth embodiment shown in FIG. 7 is basically the same as the second embodiment except that a p⁺-type contact region 55 is formed adjacent to the second p⁻-type region 39b in contact therewith. The p⁺-type contact region 55 and the first p⁻-type region 36 wherein the channel is formed are electrically connected without being blocked by the n⁺-type source and drain regions 34 and 35 which reach the bottom of the insular body 33.

The location of the contact region may be selected arbitrarily according to the arrangement of the elements on the semiconductor device, so that it is possible to improve the integration density.

In the embodiments described heretofore, the insular body 33 to which a fixed voltage is to be applied is a p⁻-type body. However, it is of course possible to apply the present invention to a semiconductor device having the SOI structure in which an n-type insular body is to be applied with the fixed voltage.

In each of the embodiments, the second p⁻-type regions 39a and 39b are formed along both sides of the n⁺-type source and drain regions 34 and 35, but it is also possible to provide a single second p⁻-type region along only one side of the source and drain regions 34 and 35. The p⁺-type contact region must of course be in contact with the first p⁻-type region 36 and be formed in contact with the single second p⁻-type region. However, when the second p⁻-type regions 39a and 39b are formed along both sides of the source and drain regions 34 and 35, there are advantages in that the widths of the source and drain regions 34 and 35 are restricted by self-alignment, and the characteristic of the semiconductor device will not change even when there is a positioning error of the gate electrode 38 when the semiconductor is produced. Furthermore, according to the embodiments described heretofore, the p⁺-type contact region will not make contact with junctions between the first p⁻-type region (channel region) 36 and the source and drain regions 34 and 35 and a short circuit will not occur, even when the width of the gate electrode 38 is narrow.

The application of the present invention is not limited to the formation of the contact region for the MIS field effect transistor (FET) formed on the semiconductor device having the SOI structure, and it is possible to apply the present invention to the formation of a base contact for a bipolar transistor formed on the semiconductor device having the SOI structure, such as a lateral npn transistor and a lateral pnp transistor.

Further, the present invention is not limited to these embodiments, but various variations and modifications may be made without departing from the scope of the present invention.

What is claimed is:

1. A semiconductor device having a silicon on insulator structure comprising:
   an insulator layer;
   an insular body formed on said insulator layer, said insular body being made of a single crystal silicon doped to a first type semiconductor;
   a first region of the first type semiconductor provided in said insular body;
   first and second doped regions doped to a second type semiconductor respectively provided in said insular body on both sides of said first region, said first and second doped regions reaching a bottom of said insular body and having a width smaller than a width of said insular body;

a second region doped to the first type semiconductor formed along at least one side of said first and second doped regions, said second region being in contact with said first region; and a contact region doped to the first type semiconductor formed in contact with said second region, said contact region having an impurity density greater than those of said first and second regions, said first region being applied with a fixed voltage via said contact region.

2. A semiconductor device having a silicon on insulator structure as claimed in claim 1 in which said second region is formed along both sides of said first and second doped regions.

3. A semiconductor device having a silicon on insulator structure as claimed in claim 1 which further comprises a gate insulator layer formed on said first region across a width direction of said insular body, and a gate electrode formed on said gate insulator layer.

4. A semiconductor device having a silicon on insulator structure as claimed in claim 3 in which said contact region is formed at such a position that an end portion of said gate insulator layer overlaps a portion of said contact region.

5. A semiconductor device having a silicon on insulator structure as claimed in claim 3 in which said contact region is formed at such a position that avoids contact with said gate insulator layer.

6. A semiconductor device having a silicon on insulator structure as claimed in claim 1 in which said said contact region is formed at a position adjacent to said first doped region.

7. A semiconductor device having a silicon on insulator structure as claimed in claim 6 which further comprises an insulator layer provided between said first doped region and said contact region, said insulator layer between said second doped region and said contact region reaching the bottom of said insular body.

8. A semiconductor device having a silicon on insulator structure as claimed in claim 1 in which said first and second doped regions are source and drain regions of a metal oxide semiconductor field effect transistor.

9. A semiconductor device having a silicon on insulator structure as claimed in claim 1 which further comprises a gate insulator layer formed on said first region across a width direction of said insular body, a gate electrode formed on said gate insulator layer, a source wiring in contact with said first doped region, a drain wiring in contact with said second doped region, a gate wiring in contact with said gate electrode, and a contact wiring in contact with said contact region.

10. A semiconductor device having a silicon on insulator structure as claimed in claim 1 in which said first and second type semiconductors are p-type and n-type semiconductors, respectively.

11. A semiconductor device having a silicon on insulator structure as claimed in claim 1 in which said first and second type semiconductors are n-type and p-type semiconductors, respectively.

* * * * *